(12) United States Patent
Xiang et al.

(10) Patent No.: US 12,336,365 B2
(45) Date of Patent: Jun. 17, 2025

(54) ORGANIC LIGHT-EMITTING DISPLAY PANEL AND ORGANIC LIGHT-EMITTING DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yepeng Xiang, Wuhan (CN); Mugyeom Kim, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 411 days.

(21) Appl. No.: 17/780,301

(22) PCT Filed: May 23, 2022

(86) PCT No.: PCT/CN2022/094417
§ 371 (c)(1),
(2) Date: May 26, 2022

(87) PCT Pub. No.: WO2023/206674
PCT Pub. Date: Nov. 2, 2023

(65) Prior Publication Data
US 2023/0354628 A1    Nov. 2, 2023

(30) Foreign Application Priority Data
Apr. 28, 2022 (CN) .......................... 202210470568.4

(51) Int. Cl.
*H10K 50/11* (2023.01)
*H10K 71/00* (2023.01)
(Continued)

(52) U.S. Cl.
CPC ............. *H10K 50/11* (2023.02); *H10K 71/00* (2023.02); *H10K 2101/30* (2023.02); *H10K 2101/40* (2023.02); *H10K 2102/351* (2023.02)

(58) Field of Classification Search
CPC .... H10K 50/11; H10K 71/00; H10K 2101/30; H10K 2101/40; H10K 2102/351
See application file for complete search history.

(56) References Cited

U.S. PATENT DOCUMENTS

2006/0003487 A1* 1/2006 Chung .................. H10K 50/11
438/69
2017/0194591 A1 7/2017 Wang et al.

FOREIGN PATENT DOCUMENTS

CN     102163696 A     8/2011
CN     102244199 A     11/2011
(Continued)

OTHER PUBLICATIONS

PCT International Search Report for International Application No. PCT/CN2022/094417, mailed on Jan. 18, 2023, 8pp.
(Continued)

*Primary Examiner* — Julia Slutsker
(74) *Attorney, Agent, or Firm* — The Roy Gross Law Firm, LLC; Roy D. Gross

(57) ABSTRACT

The present disclosure provides an organic light-emitting display panel and an organic light-emitting display device. The organic light-emitting display panel includes a light-emitting layer. The light-emitting layer includes at least two light-emitting units arranged in layers. Each of the light-emitting units includes a first light-emitting sublayer and a second light-emitting sublayer which are both one of a host material layer and a guest material layer, and a third light-emitting sublayer that is another one of the host material layer and the guest material layer. The third light-emitting
(Continued)

sublayer is disposed between the first light-emitting sublayer and the second light-emitting sublayer.

20 Claims, 8 Drawing Sheets

(51) Int. Cl.
  *H10K 101/30* (2023.01)
  *H10K 101/40* (2023.01)
  *H10K 102/00* (2023.01)

(56) References Cited

FOREIGN PATENT DOCUMENTS

| | | |
|---|---|---|
| CN | 106803543 A | 6/2017 |
| CN | 108987592 A | 12/2018 |
| CN | 109473561 A | 3/2019 |
| CN | 112349857 A | 2/2021 |
| CN | 113299844 A | 8/2021 |
| CN | 114220928 A | 3/2022 |
| JP | 2012099593 A | 5/2012 |
| WO | 2022062699 A1 | 3/2022 |

OTHER PUBLICATIONS

PCT Written Opinion of the International Search Authority for International Application No. PCT/CN2022/094417, mailed on Jan. 18, 2023, 7pp.

Chinese Office Action issued in corresponding Chinese Patent Application No. 202210470568.4 dated Apr. 27, 2025, pp. 1-7, 19pp.

Kun-peng Wang, Kai Yu, Jing-hua Lv, Mao-lin Zhang, Fan-xue Meng, and Baibin Zhou (2019). A Host—Guest Supercapacitor Electrode Material Based on a Mixed Hexa-Transition Metal Sandwiched Arsenotungstate Chain and Three-Dimensional Supramolecular Metal Organic Networks with One-Dimensional Cavities. Inorganic Chemistry, vol. 58, Issue No. 12, 7947-7957. DOI: 10.1021/acs.inorgchem.9b00692.

\* cited by examiner

ORGANIC LIGHT-EMITTING DISPLAY PANEL AND ORGANIC LIGHT-EMITTING DISPLAY DEVICE

CROSS REFERENCE TO RELATED APPLICATIONS

This application is a National Phase of PCT Patent Application No. PCT/CN2022/094417 having International filing date of May 23, 2022, which claims the benefit of priority of Chinese Patent Application No. 202210470568.4, filed Apr. 28, 2022, the contents of which are all incorporated herein by reference in their entirety.

FIELD OF INVENTION

The present disclosure relates to a field of display technology, and particularly relates to an organic light-emitting display panel and an organic light-emitting display device.

BACKGROUND OF INVENTION

Compared with liquid crystal display screens, organic light-emitting diode (OLED) display screens have advantages of lightness and thinness, good display effects, high resolution, wide color gamut, more energy saving, and flexibility, and such. In recent years, organic light-emitting display technology has developed rapidly and has become a first choice for screens of mobile phones and other terminal products.

Currently, light-emitting layers in organic light-emitting diode light-emitting devices are nearly always doped with guest light-emitting materials in host materials, and the host materials with higher energy transfer the energy to the guest light-emitting materials to emit light. In organic light-emitting display devices with these host-guest doped light-emitting layers, a longer service lifespan is one of important indexes of excellent performance.

Technical Problems

In view of this, a purpose of the present disclosure is to provide an organic light-emitting display panel and an organic light-emitting display device capable of prolonging a service lifespan.

Technical Solutions

The present disclosure provides an organic light-emitting display panel, including:
  a substrate;
  a first electrode disposed on the substrate;
  a second electrode disposed on a side of the first electrode away from the substrate and opposite to the first electrode; and
  a light-emitting layer disposed between the first electrode and the second electrode, wherein the light-emitting layer includes at least two light-emitting units arranged in layers, each of the light-emitting units includes a first light-emitting sublayer, a second light-emitting sublayer, and a third light-emitting sublayer, the third light-emitting sublayer is disposed between the first light-emitting sublayer and the second light-emitting sublayer;
  wherein the first light-emitting sublayer and the second light-emitting sublayer are both one of a host material layer and a guest material layer, and the third light-emitting sublayer is another one of the host material layer and the guest material layer.

Optionally, in an embodiment, in each of the light-emitting units, a material of the first light-emitting sublayer and a material of the second light-emitting sublayer are same, and a thickness difference between the first light-emitting sublayer and the second light-emitting sublayer does not exceed 5 Å.

Optionally, in an embodiment, in adjacent two of the light-emitting units, the first light-emitting sublayer and the second light-emitting sublayer adjacent to each other are both the host material layer, a sum of a thickness of the first light-emitting sublayer and a thickness of the second light-emitting sublayer adjacent to each other is greater than or equal to 15 Å; or
  in the adjacent two of the light-emitting units, the first light-emitting sublayer and the second light-emitting sublayer adjacent to each other are both the guest material layer, the sum of the thickness of the first light-emitting sublayer and the thickness of the second light-emitting sublayer adjacent to each other is greater than or equal to 3 Å.

Optionally, in an embodiment, in the adjacent two of the light-emitting units, the thickness of the first light-emitting sublayer and the thickness of the second light-emitting sublayer adjacent to each other are same.

Optionally, in an embodiment, in the adjacent two of the light-emitting units, the thickness of the first light-emitting sublayer and the thickness of the second light-emitting sublayer adjacent to each other are different.

Optionally, in an embodiment, a thickness ratio of the guest material layer to the host material layer is less than or equal to 0.25.

Optionally, in an embodiment, a thickness of each of the light-emitting units is greater than or equal to 2 nm, and the light-emitting layer comprises 2 to 10 of the light-emitting units.

Optionally, in an embodiment, a thickness of the light-emitting layer ranges from 150 Å to 250 Å.

Optionally, in an embodiment, an energy level difference between a lowest unoccupied molecular orbital energy level of a host material in the host material layer and a lowest unoccupied molecular orbital energy level of a guest material in the guest material layer is greater than 0 and less than or equal to 0.3 eV; and/or
  an energy level difference between a highest unoccupied molecular orbital energy level of the guest material in the guest material layer and a highest unoccupied molecular orbital energy level of the host material in the host material layer is greater than 0 and less than or equal to 0.3 eV.

Optionally, in an embodiment, the guest material layer is a phosphorescent material layer or a fluorescent material layer.

Optionally, in an embodiment, a wavelength of a luminescence peak of the guest material layer is between 450 nm and 475 nm, a half-width of the guest material layer is less than or equal to 35 nm, and a film-state luminescence quantum yield of the guest material layer is greater than or equal to 60%.

The present disclosure provides an organic light-emitting display device, including a processor and the organic light-emitting display panel according to any one of above, wherein the organic light-emitting display panel is electrically connected with the processor.

Optionally, in an embodiment, in each of the light-emitting units, a material of the first light-emitting sublayer and a material of the second light-emitting sublayer are same, and a thickness difference between the first light-emitting sublayer and the second light-emitting sublayer does not exceed 5 Å.

Optionally, in an embodiment, in adjacent two of the light-emitting units, the first light-emitting sublayer and the second light-emitting sublayer adjacent to each other are both the host material layer, a sum of a thickness of the first light-emitting sublayer and a thickness of the second light-emitting sublayer adjacent to each other is greater than or equal to 15 Å; or in the adjacent two of the light-emitting units, the first light-emitting sublayer and the second light-emitting sublayer adjacent to each other are both the guest material layer, the sum of the thickness of the first light-emitting sublayer and the thickness of the second light-emitting sublayer adjacent to each other is greater than or equal to 3 Å.

Optionally, in an embodiment, in the adjacent two of the light-emitting units, the thickness of the first light-emitting sublayer and the thickness of the second light-emitting sublayer adjacent to each other are same.

Optionally, in an embodiment, in the adjacent two of the light-emitting units, the thickness of the first light-emitting sublayer and the thickness of the second light-emitting sublayer adjacent to each other are different.

Optionally, in an embodiment, a thickness ratio of the guest material layer to the host material layer is less than or equal to 0.25.

Optionally, in an embodiment, a thickness of each of the light-emitting units is greater than or equal to 2 nm, and the light-emitting layer comprises 2 to 10 of the light-emitting units.

Optionally, in an embodiment, a thickness of the light-emitting layer ranges from 150 Å to 250 Å.

Optionally, in an embodiment, an energy level difference between a lowest unoccupied molecular orbital energy level of a host material in the host material layer and a lowest unoccupied molecular orbital energy level of a guest material in the guest material layer is greater than 0 and less than or equal to 0.3 eV; and/or an energy level difference between a highest unoccupied molecular orbital energy level of the guest material in the guest material layer and a highest unoccupied molecular orbital energy level of the host material in the host material layer is greater than 0 and less than or equal to 0.3 eV.

Beneficial Effects

An organic light-emitting display panel of the present disclosure adopts a plurality of light-emitting units arranged in layers to form a light-emitting layer of a device, a structure of each of the light-emitting units is that one guest material layer is sandwiched between two host material layers, or one host material layer is sandwiched between two guest material layers. In each of the light-emitting units, exciton recombination regions are formed only at an interface between the host material layer and the guest material layer, and a plurality of dispersed exciton recombination regions are formed in the light-emitting layer, thus reducing concentrations of excitons in the exciton recombination regions, reducing quenching of the excitons and thermal radiation, and effectively prolonging a service lifespan.

DESCRIPTION OF DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

DETAILED DESCRIPTION OF EMBODIMENTS

Figure 1:
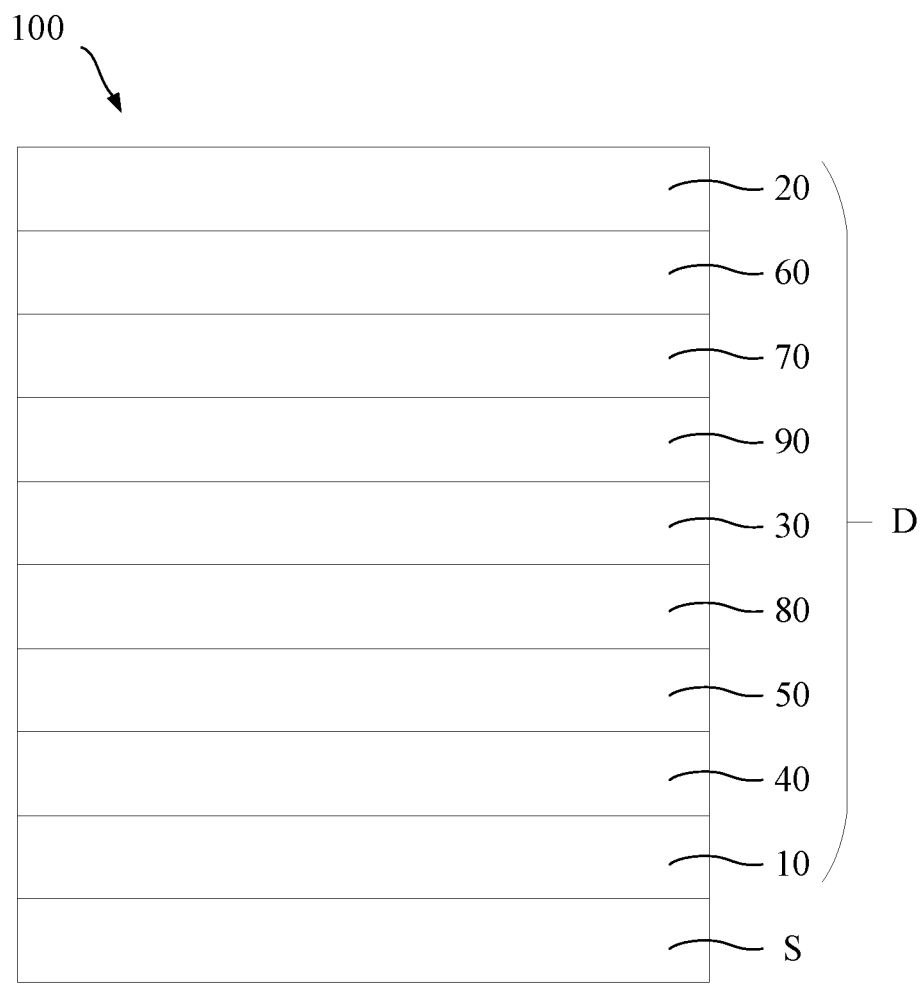
FIG. 1 is a schematic structural diagram of an organic light-emitting display panel of the present disclosure.

The technical solutions in the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

In the present disclosure, unless specified or limited otherwise, a structure in which a first feature is "on" or "below" a second feature may include an embodiment in which the first feature is directly connected with the second feature, and may also include an embodiment in which the first feature and the second feature are not directly connected with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature. In addition, terms such as "first" and "second" are used herein for purposes of description and should not be interpreted as indication or implication of relative importance, or implied indication of a number of the technical features. Therefore, features limited by terms such as "first" and "second" can explicitly or impliedly include one or more than one of these features.

The present disclosure provides an organic light-emitting display panel and an organic light-emitting display device. The organic light-emitting display panel includes a substrate and a light-emitting layer disposed on the substrate. The light-emitting layer includes at least two light-emitting units arranged in layers, the light-emitting units include a first light-emitting sublayer, a second light-emitting sublayer, and a third light-emitting sublayer, the third light-emitting sublayer is disposed between the first light-emitting sublayer and the second light-emitting sublayer. The first light-emitting sublayer and the second light-emitting sublayer are both one of a host material layer and a guest material layer, and the third light-emitting sublayer is another one of the host material layer and the guest material layer.

In a single-layer doped light-emitting layer of prior art, a host material and a guest material are evenly mixed together. During a working process of the doped light-emitting layer, concentrations of excitons are too high and exciton recombination regions are concentrated, resulting in serious quenching of the excitons, thereby resulting in a reduction of a service lifespan of a device. However, in an organic light-emitting display device of the present disclosure, by adopting a plurality of the light-emitting units arranged in layers to form the light-emitting layer in the device, a structure of each of the light-emitting units is that one guest material layer is sandwiched between two host material layers or one host material layer is sandwiched between two guest material layers. In each of the light-emitting units, the exciton recombination regions are formed only at an interface between the host material layer and the guest material layer, and a plurality of dispersed exciton recombination regions are formed in the light-emitting layer, thus reducing the concentrations of the excitons in the exciton recombination regions, reducing the quenching of the excitons and thermal radiation, and effectively prolonging the service lifespan. On another hand, due to the reduction of the quenching of the excitons, luminous efficiency of the device is correspondingly improved.

Below, various embodiments of the present disclosure will be described with reference to accompanying drawings.

Referring to FIG. 1, an organic light-emitting display panel 100 includes a substrate S and an organic light-emitting display device D disposed on the substrate S.

According to driving types, the organic light-emitting display panel 100 may be an active-matrix organic light-emitting diode (AMOLED) display panel or a passive-matrix organic light-emitting diode (PMOLED) display panel. It should be noted that, although not shown in the figures, a driving circuit layer for driving the organic light-emitting display device D to emit light is further disposed between the substrate S of the organic light-emitting display panel 100 and the organic light-emitting display device D, and the driving circuit layer includes an active matrix driving circuit or a passive matrix driving circuit. In addition, the organic light-emitting display panel 100 further includes other functional structures not shown in the figures, such as a pixel definition layer and an encapsulation layer, etc.

The organic light-emitting display panel 100 may be a rigid display panel or a flexible display panel. According to its type, the substrate S of the organic light-emitting display panel 100 may be glass, plastic, or a flexible substrate. The flexible substrate may include two flexible bases and a barrier layer disposed between two flexible bases. Materials of the two flexible bases are independently selected from one of polyimide (PI), polyethylene naphthalate (PEN), polyethylene terephthalate (PET), polyarylate (PAR), polycarbonate (PC), polyetherimide (PEI), and polyethersulfone (PES). A material of the barrier layer may be selected from inorganic materials such as silicon oxide (SiOx), silicon nitride (SiNx), silicon oxynitride (SiON), and their laminations to prevent diffusion of water vapor from the flexible bases to the driving circuit layer. Optionally, the substrate S of the present embodiment is glass.

The organic light-emitting display device D includes a first electrode 10, a second electrode 20, and a light-emitting layer 30. The first electrode 10 is disposed on the substrate S. The second electrode 20 is disposed on a side of the first electrode 10 away from the substrate S and opposite to the first electrode 10.

Optionally, the first electrode 10 is an anode, and the anode may be a transparent electrode or a non-transparent electrode. The anode may include metal and/or metal oxide. The metal may be aluminum, gold, or silver, etc. The metal oxide may be indium tin oxide or tin oxide, etc. The second electrode 20 is a cathode, and the cathode may be the transparent electrode or the non-transparent electrode. The cathode may include metal and/or metal oxide. The metal may be metals with lower work functions such as lithium, magnesium, calcium, strontium, aluminum, or indium; or their alloys with copper, gold, or silver. The metal oxide may be indium tin oxide or tin oxide, etc. The organic light-emitting display device D may be a top-emitting OLED (TEOLED) device or a bottom-emitting OLED (BEOLED). In the present embodiment, the organic light-emitting display device D is a top-emitting device. The anode is a metal electrode, and the cathode is the transparent electrode.

It may be understood that, in other embodiments, the organic light-emitting display device D may be an inverted OLED device, that is, the first electrode 10 is the cathode, and the second electrode 20 is the anode.

The light-emitting layer 30 is disposed between the first electrode 10 and the second electrode 20. The light-emitting layer 30 includes at least two light-emitting units 31 arranged in layers. The light-emitting units 31 include a first light-emitting sublayer 311, a second light-emitting sublayer 312, and a third light-emitting sublayer 313. The third light-emitting sublayer 313 is disposed between the first light-emitting sublayer 311 and the second light-emitting sublayer 312.

The first light-emitting sublayer 311 and the second light-emitting sublayer 312 are both one of a host material layer and a guest material layer, and the third light-emitting sublayer 313 is another one of the host material layer and the guest material layer. Specifically, referring to FIG. 2, in an embodiment, the first light-emitting sublayer 311 and the second light-emitting sublayer 312 are both the host material layer, and the third light-emitting sublayer 313 is the guest material layer. Taking the light-emitting layer 30 including at least three light-emitting units 31 as an example, in a direction from the first electrode 10 to the second electrode 20, a structure of the light-emitting layer 30 is: the host material layer—the guest material layer—the host material layer—the host material layer—the guest material layer—the host material layer—(middle omitted)—the host material layer—the guest material layer. In this embodiment, light-emitting material layers in contact between adjacent two of the light-emitting units 31 are both the host material layer, and a number of the host material layers is twice a number of the guest material layers in the light-emitting layer 30.

Figure 3:
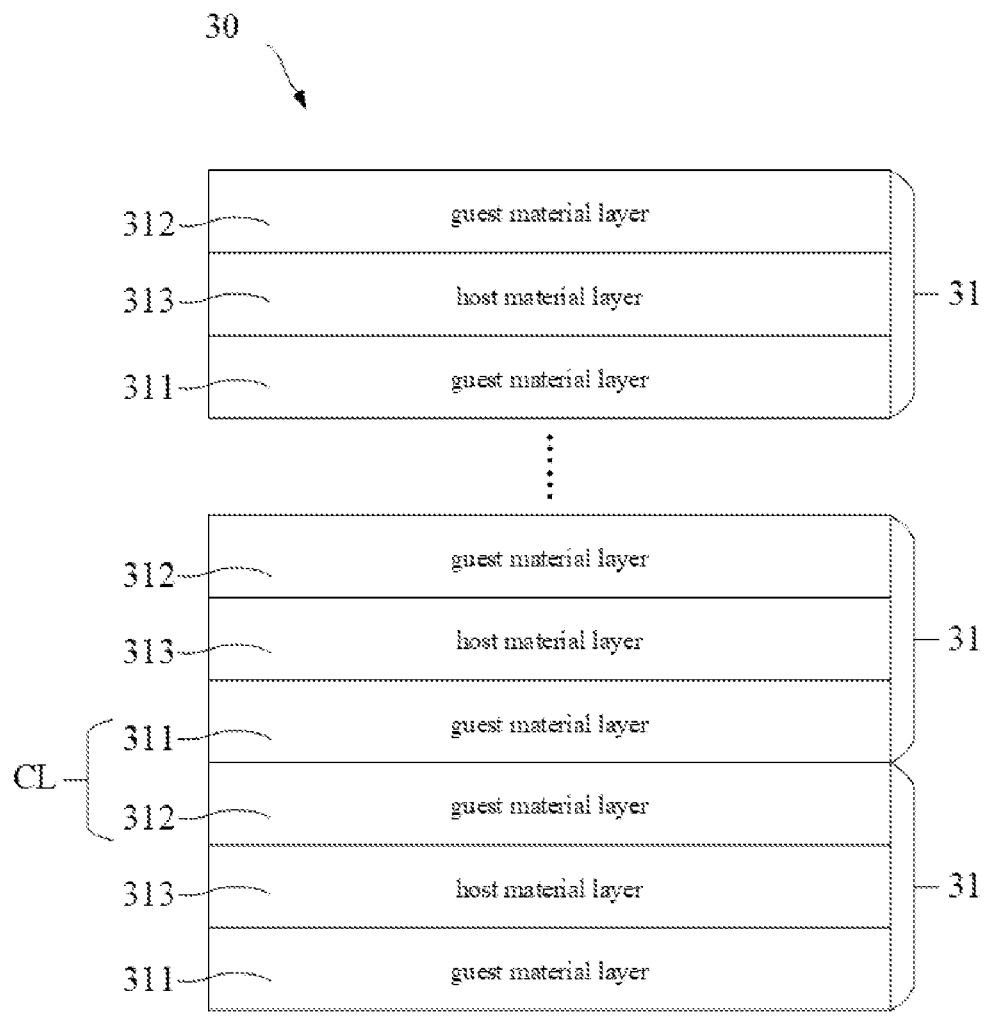
FIG. 3 is a schematic diagram of a second structure of the light-emitting layer in the organic light-emitting display panel of FIG. 1.

Referring to FIG. 3, in another embodiment, the first light-emitting sublayer 311 and the second light-emitting sublayer 312 are both the guest material layer, and the third light-emitting sublayer 313 is the host material layer. Taking the light-emitting layer 30 including at least three light-emitting units 31 as an example, in the direction from the first electrode 10 to the second electrode 20, the structure of the light-emitting layer 30 is: the guest material layer—the host material layer—the guest material layer—the guest material layer—the host material layer—the guest material layer—(middle omitted)—the guest material layer—the host material layer—the guest material layer. In this embodiment, the light-emitting material layers in contact between the adjacent two of the light-emitting units 31 are both the guest material layer. And the number of the guest material layers is twice the number of the host material layers in the light-emitting layer 30.

Figure 2:
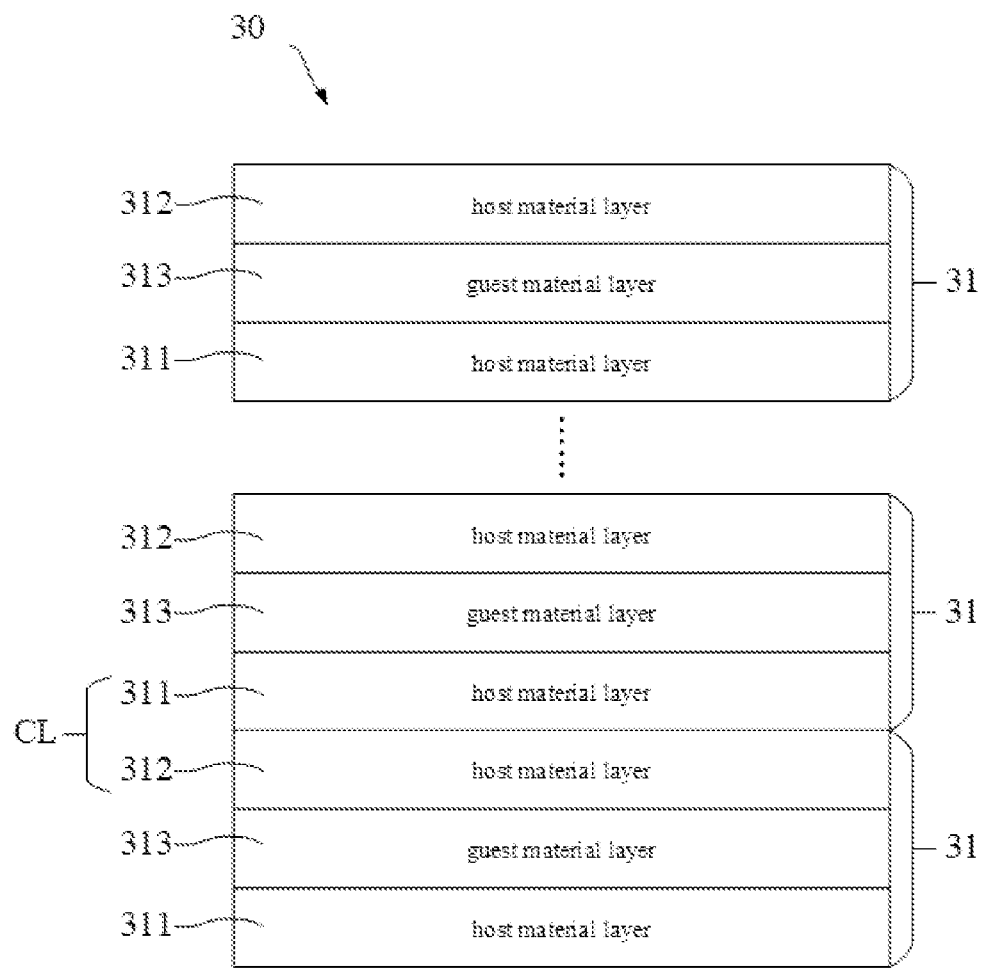
FIG. 2 is a schematic diagram of a first structure of a light-emitting layer in the organic light-emitting display panel of FIG. 1.

In the embodiments of FIG. 2 and FIG. 3, the exciton recombination regions are formed only at the interface between the host material layer and the guest material layer, however, since the adjacent first light-emitting sublayer 311 and the second light-emitting sublayer 312 of the adjacent two of the light-emitting units 31 are both the host material layer or the guest material layer, the exciton recombination regions are not formed between them. Therefore, one first light-emitting sublayer 311 and one second light-emitting sublayer 312 are spaced between the adjacent exciton recombination regions (or the interfaces) in the adjacent two of the light-emitting units 31. The adjacent exciton recombination regions in each of the light-emitting units 31 are spaced apart by the two light-emitting sublayers, thereby further reducing the quenching of the excitons and improving the service life.

Optionally, in each of the light-emitting units 31, a material of the first light-emitting sublayer 311 and a material of the second light-emitting sublayer 312 are same, and a thickness of the first light-emitting sublayer 311 and a thickness of the second light-emitting sublayer 312 are roughly equal. "Roughly equal" means that the first light-emitting sublayer 311 and the second light-emitting sublayer 312 may be formed under exactly same process conditions, parameters, and designed thickness, however, the thickness may be slightly different due to errors in manufacturing processes. Quantitatively, a thickness difference between the first light-emitting sublayer 311 and the second light-emitting sublayer 312 does not exceed 5 Å. In actual products, layering of the light-emitting layer 30 in contact between the adjacent two of the light-emitting units 31 is not obvious. Therefore, the first light-emitting sublayer 311 and the second light-emitting sublayer 312 in contact between the adjacent two of the light-emitting units 31 may further be regarded as a common light-emitting layer CL. Under conditions that the thickness of the first light-emitting sublayer 311 and the thickness of the second light-emitting sublayer 312 are roughly equal, a thickness of the common light-emitting layer CL between the adjacent two of the light-emitting units 31 is about twice the thickness of the first light-emitting sublayer 311 closest to the first electrode 10 in the light-emitting layer 30 or twice the thickness of the second light-emitting sublayer 312 closest to the second electrode 20 in the light-emitting layer 30 (namely, the first light-emitting sublayer 311 and the second light-emitting sublayer 312 located at two ends of the light-emitting layer 30 respectively).

Figure 4A:
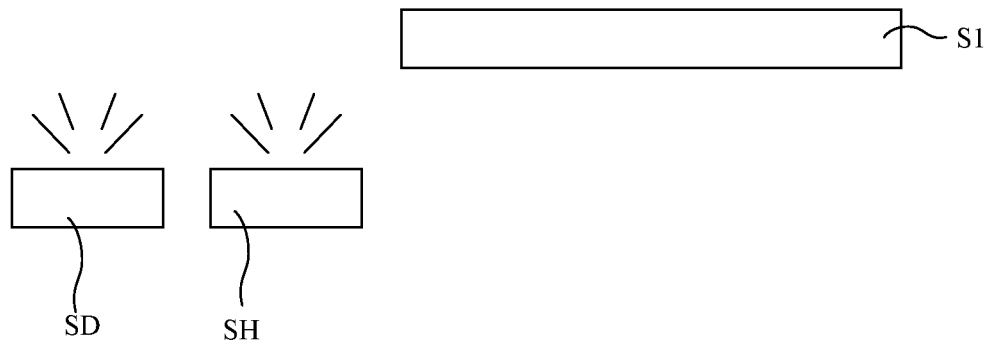
FIG. 4($a$) to FIG. 4($e$) are schematic diagrams of partial manufacturing steps of a light-emitting layer in an organic light-emitting display panel of the present disclosure.
Figure 4B:
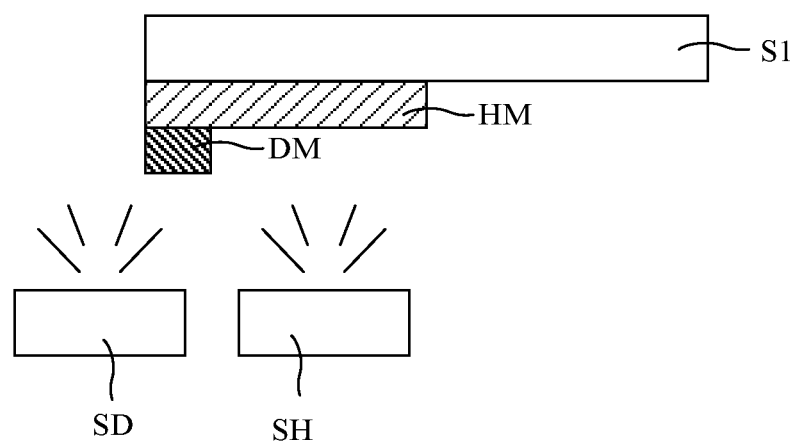
Figure 4C:
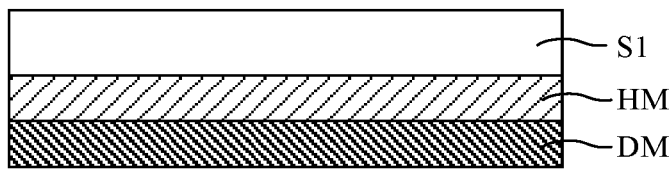
Figure 4C:
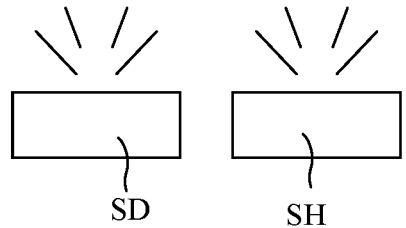
Figure 4D:
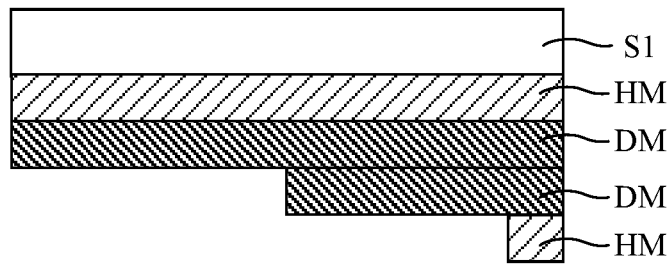
Figure 4D:
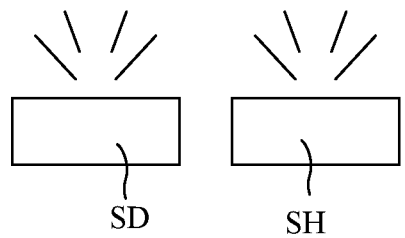
Figure 4E:
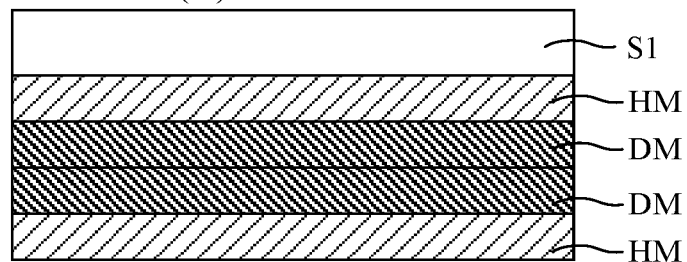
Figure 4E:
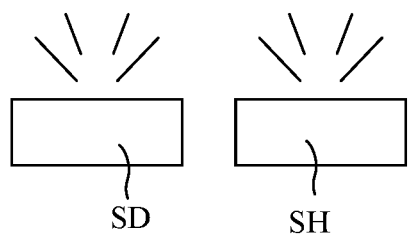

Referring to FIG. 4(a) to FIG. 4(e), a reason for making this kind of design is that inventors found that production efficiency of display devices with the structure of a plurality of the light-emitting units 31 of the present disclosure is highest during processes of mass production design of evaporation plating. Referring to FIG. 4(a), when the light-emitting units 31 are evaporated on an intermediate substrate S1, the intermediate substrate S1 is set in an evaporation chamber and remains stationary. A guest material evaporation source SD and a host material evaporation source SH are fixedly arranged in a direction from left to right in the figure, are located on a left side of the intermediate substrate S1, and begin to pass under the intermediate substrate S1 in the direction from the left to the right to evaporate a host material HM and a guest material DM on the intermediate substrate S1. Referring to FIG. 4(b), when the host material evaporation source SH and the guest material evaporation source SD pass under the intermediate substrate S1 for a first time, a layer of the host material HM is firstly evaporated, and then the guest material DM is evaporated on the evaporated host material HM. Referring to FIG. 4(c), when the host material vapor deposition source SH and the guest material vapor deposition source SD move to a right side of the intermediate substrate S1, the layer of the host material HM and the layer of the guest material DM are formed on the intermediate substrate S1. Next, referring to FIG. 4(d), the host material vapor deposition source SH and the guest material vapor deposition source SD start to return to a starting point in a direction from the right to the left, and pass a lower part of the intermediate substrate S1 to evaporate the guest material DM and the host material HM on the intermediate substrate S1. When the host material evaporation source SH and the guest material evaporation source SD pass under the intermediate substrate S1 for a second time, a layer of the guest material DM is evaporated on the guest material DM formed by a first evaporation, and then a layer of the host material HM is evaporated on the evaporated guest material DM. Referring to FIG. 4(e), when the host material evaporation source SH and the guest material evaporation source SD return to the left side of the intermediate substrate S1, a following structure is formed on the intermediate substrate S1: the host material layer—the guest material layer—the guest material layer—the host material layer, that is, the structure except for the guest material layer at two ends in the light-emitting layer 30 of FIG. 3. The structure above may be obtained by running the host material evaporation source SH and the guest material evaporation source SD for one round. The plurality of the light-emitting units 31 in the light-emitting layer 30 of FIG. 3 may be obtained by continuously running the host material evaporation source SH and the guest material evaporation source SD many times: the guest material layer—the host material layer—the guest material layer. However, during this process, under a situation without adjusting any execution parameters, it is neither necessary to stop movements of the host material evaporation source SH and the guest material evaporation source SD, nor necessary to reset the host material evaporation source SH and the guest material evaporation source SD to the left side after the host material evaporation source SH and the guest material evaporation source SD move to the right side each time, and the evaporation of the light-emitting units 31 may be completed to save time required for the evaporation and to improve capacity greatly. It can be understood that, the light-emitting units 31 of FIG. 2 may be obtained by exchanging positions of the host material evaporation source SH and the guest material evaporation source SD.

It should be noted that, in other embodiments of the present disclosure, the material of the first light-emitting sublayer 311 and the material of the second light-emitting sublayer 312 of each of the light-emitting units 31 may also be different, and the thickness of the first light-emitting sublayer 311 and the thickness of second light-emitting sublayer 312 of each of the light-emitting units 31 may also be not equal, for example, the thicknesses are set to gradient changes according to actual demands, etc.

On another hand, since in the present disclosure, the first light-emitting sublayer 311 and the second light-emitting sublayer 312 are disposed between the adjacent two of the light-emitting units 31, an optical path difference of light emitted in the exciton recombination regions below may be precisely adjusted by adjusting the thickness of the first light-emitting sublayer 311 and the thickness of the second light-emitting sublayer 312 between the adjacent two of the light-emitting units 31. When the optical path difference of two beams of the light reaches an integer multiple of wavelength, an interference is strengthened, light extraction efficiency is improved, and brightness is increased. Moreover, an adjustment of the thicknesses of the adjacent two of the light-emitting layers 30 may be completed in one back-and-forth operation of the host material evaporation source SH and the guest material evaporation source SD, which is convenient for precise control. Optionally, in the adjacent two of the light-emitting units 31, the thickness of the first light-emitting sublayer 311 and the thickness of the second light-emitting sublayer 312 adjacent to each other are same. Optionally, in the adjacent two of the light-emitting units 31, the thickness of the first light-emitting sublayer 311 and the thickness of the second light-emitting sublayer 312 adjacent to each other are different, thereby the optical path difference of the light may be finely adjusted by forming two film layers with different thickness.

Optionally, in order to ensure microcavity effect and host-guest ratio, in the adjacent two of the light-emitting units 31, the first light-emitting sublayer 311 and the second light-emitting sublayer 312 adjacent to each other are both the host material layer, and a sum of the thickness of the first light-emitting sublayer 311 and the thickness of the second light-emitting sublayer 312 adjacent to each other is greater than or equal to 15 Å. For example, in the embodiment of FIG. 2, the thickness of the common light-emitting layer CL is greater than or equal to 15 Å.

Optionally, in the adjacent two of the light-emitting units 31, the first light-emitting sublayer 311 and the second light-emitting sublayer 312 adjacent to each other are both the guest material layer, and the sum of the thickness of the first light-emitting sublayer 311 and the thickness of the second light-emitting sublayer 312 adjacent to each other is greater than or equal to 3 Å. For example, in the embodiment of FIG. 3, the thickness of the common light-emitting layer CL is greater than or equal to 3 Å.

Optionally, the guest material layer is a phosphorescent material layer or a fluorescent material layer. That is to say, the structure of the light-emitting layer 30 of the present disclosure may especially use both phosphorescent light-emitting materials and fluorescent light-emitting materials, both may improve the service life and light-emitting efficiency of the devices Optionally, the guest material layer is a blue phosphorescent material layer. The structure of the light-emitting layer 30 of the present disclosure is particularly suitable for a blue phosphorescent light-emitting material. The reason is: current OLED display screens consist of red, green, and blue (RGB) pixels. Wherein, luminous efficiency of the blue pixels has a greatest impact on power consumption of the OLED display screens. The light-emitting guest in a red and green light-emitting layer is a phosphorescent material. In theory, internal quantum efficiency (IQE) is 100%. However, the light-emitting guest in a blue light-emitting layer is a fluorescent material, and in theory, the theoretical internal quantum efficiency is only 25%. Based on luminescence principles and the internal quantum efficiency, in theory, luminous efficiency of the fluorescent material is lower than luminous efficiency of the phosphorescent material. However, the blue phosphorescent material may not be used in mass production due to short lifespan. However, by manufacturing the blue phosphorescent host material and the guest material into the light-emitting unit 31 in the present disclosure, the plurality of the light-emitting units 31 are stacked to form the light-emitting layer 30, and a plurality of the dispersed exciton recombination regions are formed in the light-emitting layer 30, thus reducing concentrations of the excitons in the recombination regions, reducing the quenching of the excitons and the thermal radiation, and effectively prolonging the service lifespan of the blue phosphorescent luminescent material. The service lifespan of the blue phosphorescent light-emitting material is improved to promote the blue phosphorescent material to replace the blue fluorescent material and be used in the mass production of the organic light-emitting display device D.

It should be noted that, the host material layer and the guest material layer may further be other colors, such as red, green, yellow, white phosphorescent light-emitting layer, or fluorescent light-emitting layer. The present disclosure does not limit this here.

Optionally, a thickness of each of the light-emitting units 31 is greater than or equal to 2 nm. In each of the light-emitting units 31, a thickness ratio of the guest material layer to the host material layer is less than or equal to 0.25. Specifically, a thickness of the guest material layer is m, and a thickness of the host material layer is L, then, $0 < m/L \leq 0.25$. If m/L is greater than 0.25, the thickness of the guest material layer is too thick, and the light-emitting layer 30 may nearly be regarded as a pure light-emitting material layer with serious quenching of the excitons and lower luminous efficiency. By making the thickness ratio of the guest material layer to the host material layer less than or equal to 0.25, higher luminous efficiency can be ensured.

Optionally, the light-emitting layer 30 includes 2 to 10 light-emitting units 31. Since a total thickness of the light-emitting layer 30 ranges from 150 Å to 250 Å, if a number of the light-emitting units 31 is too large, a thickness of a single-layer light-emitting layer 30 is too thin, and lifespan of the light-emitting layer 30 will be shortened contrarily. Therefore, the number of the light-emitting units 31 may not be too large.

Figure 5:
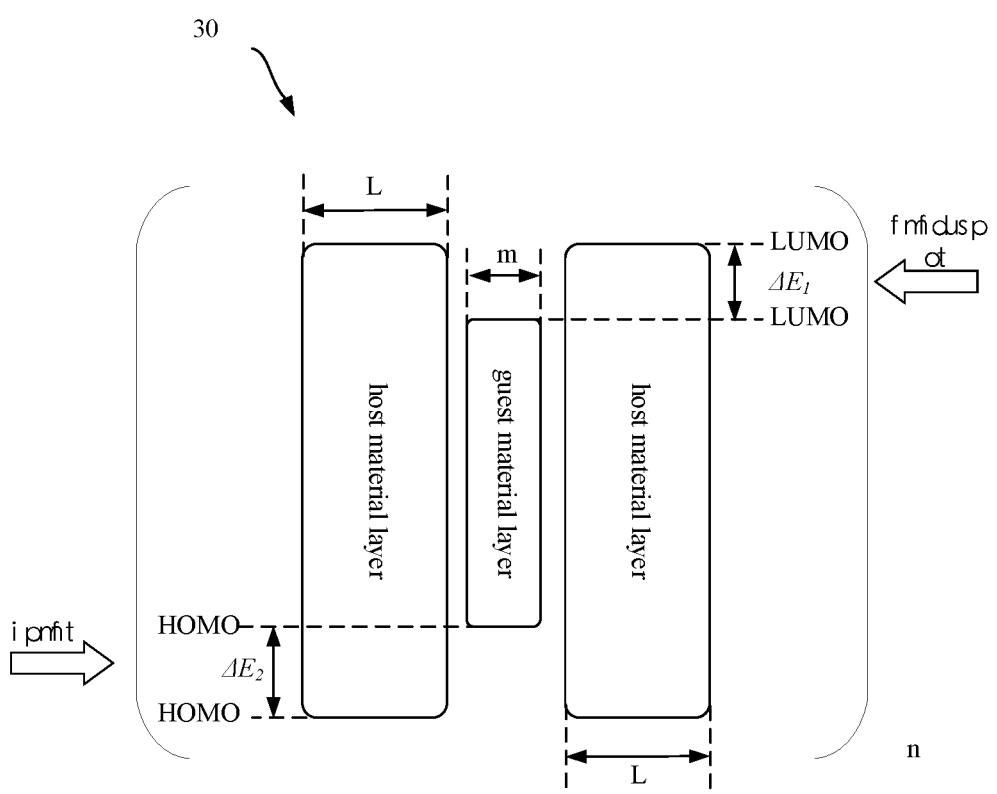
FIG. 5 is a schematic diagram of an energy level difference between a host material layer and a guest material layer in the light-emitting layer of FIG. 2.
Figure 6:
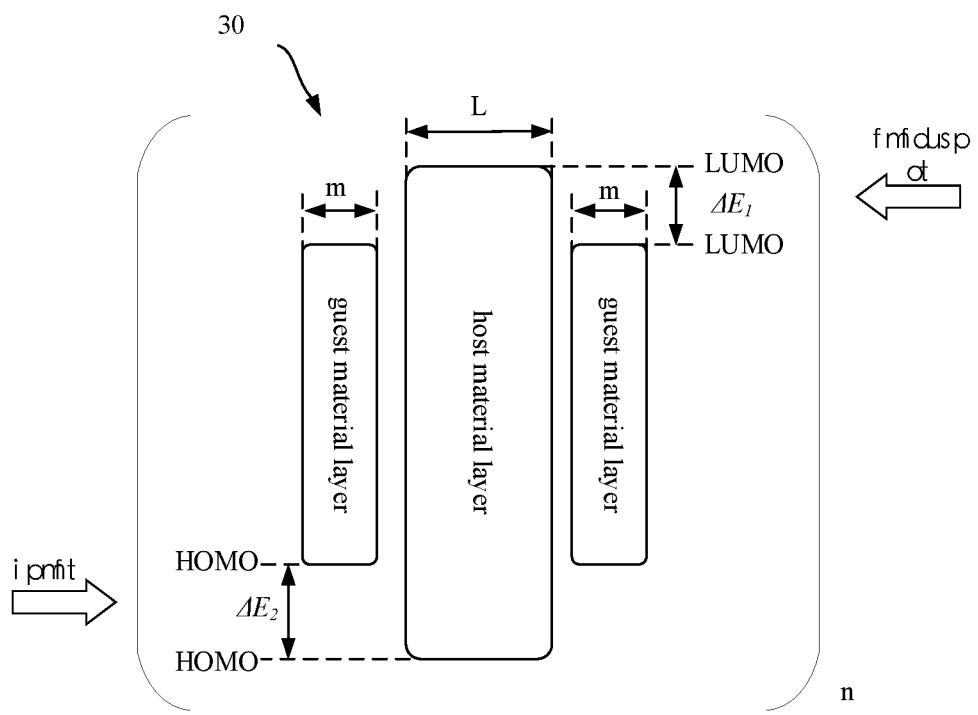
FIG. 6 is a schematic diagram of the energy level difference between the host material layer and the guest material layer in the light-emitting layer of FIG. 3.

Optionally, the thickness of the light-emitting layer 30 ranges from 150 Å to 250 Å. Greater the thickness of the light-emitting layer 30, greater a driving voltage is; thinner the light-emitting layer 30, shorter the service lifespan is. When the thickness of the light-emitting layer 30 ranges from 150 Å to 250 Å, a more appropriate driving voltage and the service lifespan may be obtained. Optionally, referring to FIG. 5 and FIG. 6, in FIG. 5 and FIG. 6, n represents a number of the light-emitting units 31. An energy level difference $\Delta E_1$ between a lowest unoccupied molecular orbital (LUMO) energy level of the host material in the host material layer and a LUMO energy level of the guest material in the guest material layer is greater than 0 and less than or equal to 0.3 eV. And/or, an energy level difference $\Delta E_2$ between a highest unoccupied molecular orbital (HOMO) energy level of the guest material in the guest material layer and a HOMO energy level of the host material in the host material layer is greater than 0 and less than or equal to 0.3 eV. Specifically, the HOMO energy level of the guest material is greater than the HOMO energy level of the host material layer, and the LUMO energy level of the host material is greater than the LUMO energy level of the guest material layer. However, a HOMO energy level difference between the host material and the guest material and a LUMO energy level difference between the host material and the guest material are set to be less than or equal to 0.3 eV. Smaller the energy level difference is, the easier transition of holes and electrons between each of the light-emitting units 31 is, and the holes and the electrons may pass between adjacent light-emitting units 31 and recombine, thereby improving the light-emitting efficiency. It should be noted that, the host material layer may include one or more than one kind of the host material, and the guest material layer may also include one or more than one kind of the guest material. An energy level relationship between each kind of the host material and each kind of the guest material satisfies the above energy level difference requirements.

Optionally, in a specific embodiment, the host material layer includes at least one kind of a blue fluorescent host material or the blue phosphorescent host material, and a mass percentage of each kind of the host material is greater than or equal to 10% to balance the concentrations of the carriers. Furthermore, hole mobility of each kind of the host material is greater than $10^{-3}$ $cm^2*V^{-1}*S^{-1}$, and electron mobility of each kind of the host materials is greater than $10^{-5}$ $cm^2*V^{-1}*S^{-1}$. The guest material layer is composed of one kind of the guest material, and the guest material is the blue fluorescent light-emitting material or the blue phosphorescent light-emitting material. A wavelength of a luminescence peak of the guest material layer is between 450 nm and 475 nm. A half-width of the guest material layer is less than or equal to 35 nm. A film-state luminescence quantum yield of the guest material layer is greater than or equal to 60%.

Optionally, referring to FIG. 1 again, the organic light-emitting display panel 100 further includes a hole injection layer 40 and a hole transport layer 50 sequentially stacked between the first electrode 10 and the light-emitting layer 30, and an electron injection layer 60 and an electron transport layer 70 sequentially stacked between the second electrode 20 and the light-emitting layer 30. The hole injection layer 40 may include a p-type dopant. The hole injection layer 40 may include HATCN. The hole transport layer 50 may include NPB. The electron injection layer 60 may be LiQ. The electron transport layer 70 may include TPBI and LiQ. Furthermore, the organic light-emitting display panel 100 further includes an electron blocking layer 80 disposed between the hole transport layer 50 and the light-emitting layer 30, and a hole blocking layer 90 disposed between the electron transport layer 70 and the light-emitting layer 30. The electron blocking layer 80 may include an electron blocking material or an exciton blocking material. The hole blocking layer 90 includes a hole blocking material or the exciton blocking material.

Figure 7:
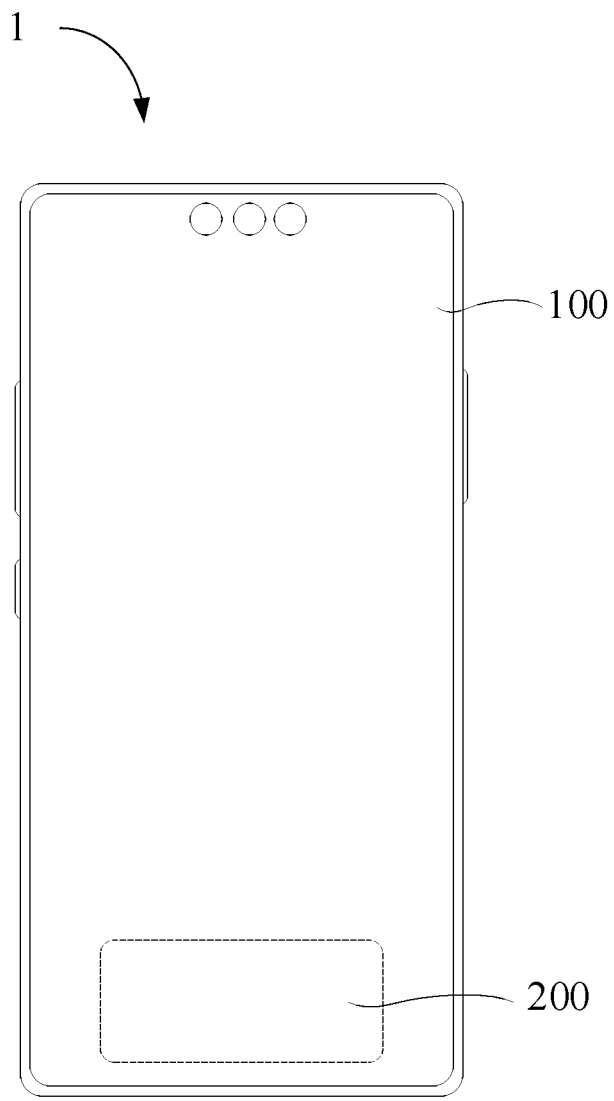
FIG. 7 is a schematic structural diagram of an organic light-emitting display device of the present disclosure.

Referring to FIG. 7, the present disclosure further provides an organic light-emitting display device 1. The organic light-emitting display device 1 in the embodiment of the present disclosure may be a mobile phone, a tablet computer, an electronic reader, an electronic display screen, a notebook computer, a mobile phone, an augmented reality (AR)/virtual reality (VR) device, a media player, a wearable device, a digital camera, and a car navigator, etc. The organic light-emitting display device 1 includes a processor 200 and the organic light-emitting display panel 100 provided by the present disclosure. The processor 200 may include a driving chip or the like for driving the organic light-emitting display panel 100 to emit light.

Below, the organic light-emitting device of the present disclosure will be described with reference to specific embodiments.

Embodiment 1

The organic light-emitting display device is manufactured according to a method disclosed in reference Xiang et al., Acceptor plane expansion enhances horizontal orientation of thermally activated delayed fluorescence emitters, Sci. Adv. 2020; Vol 6, Issue 41, DOI: 10.1126/sciadv.aba7855. The specific method is:

Take glass as the substrate and indium tin oxide (ITO) as the anode. Under a high vacuum condition, the hole injection layer, the hole transport layer, the light-emitting layer, the electron transport layer, the electron injection layer, and the cathode are sequentially formed by the evaporation on a cleaned conductive glass (ITO) substrate. The hole injection layer is 10 nm HATCN, and the hole transport layer is 100 nm NPB. The light-emitting layer adopts a light-emitting unit structure of the host material layer—the guest material layer—the host material layer. The total thickness of the light-emitting layer is 20 nm. A thickness L of the host material layer in contact with the light-emitting layer and the hole transport layer is 2.25 nm, and the thickness in of the guest material layer is 0.5 nm. The number of the light-emitting units is 4. The electron transport layer is evaporated by TPBI and LiQ in a ratio of 1:1, and a thickness of the electron transport layer is 30 nm. The electron injection layer is 1 nm LiQ. The cathode is 100 nm aluminum. The structure of the device may be expressed as: the glass/ITO/HATCN(10 nm)/NPB(100 nm)/the light-emitting layer(2.25 nm)/TPBI+LiQ(30 nm)/LiQ(1 nm)/aluminum (100 nm). The structure of materials in each layer may refer to following chemical formulas. For a manufactured device, luminescence characteristics of the manufactured device were recorded at a current density of 10 mA/cm$^2$.

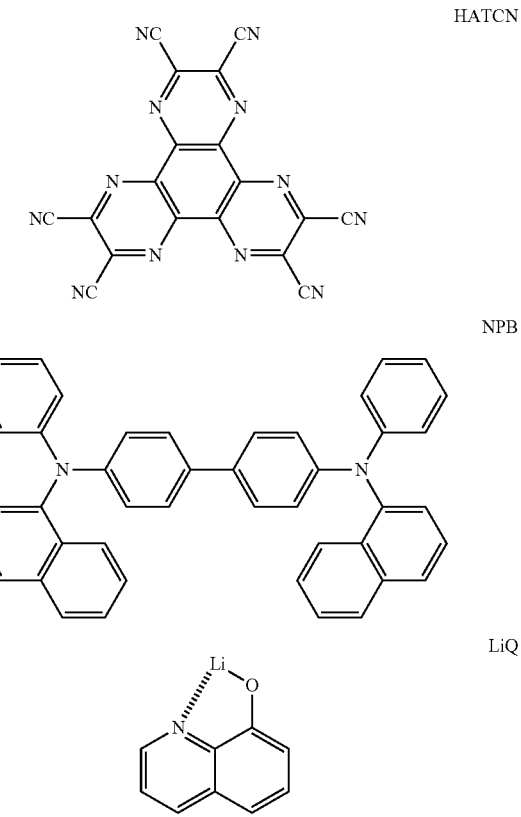

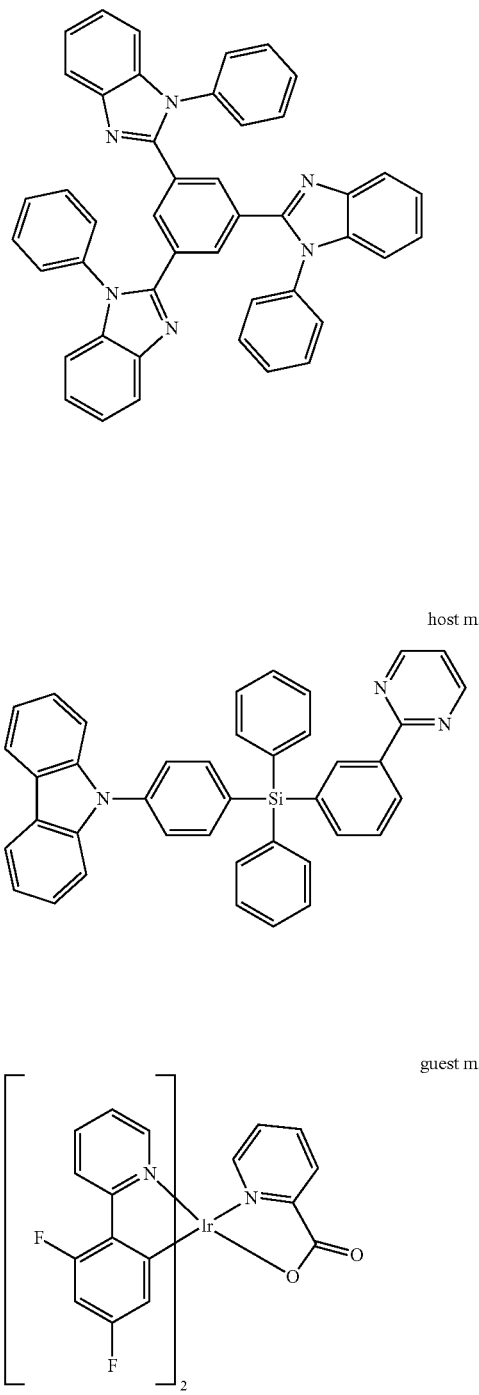

Comparative Embodiment 1

Apart from the light-emitting layer with the total thickness of 20 nm being formed by co-evaporating the guest material and the host material in the thickness ratio of 20:180, materials and parameters of other structures are same as in the embodiment 1. The luminescence characteristics of the manufactured device were recorded at the current density of 10 mA/cm².

Experimental results of the embodiment 1 and the comparative embodiment 1 are as follows:

TABLE 1

Comparison of performance parameters between the embodiment 1 and the comparative embodiment 1

| | Driving voltage (V) | Electro-luminescence peak (nm) | Maximum external quantum efficiency EQEmax(%) | LT95 (hr) |
|---|---|---|---|---|
| Embodiment 1 | 3.98 | 472 | 22.4 | 22 |
| Comparative embodiment 1 | 3.75 | 472 | 16.5 | 10 |

Lifespan tests of organic light-emitting materials usually require that after a certain constant current is applied to the OLED device, curves of its brightness versus time are measured, and then we decrease target value according to brightness and distinguish the lifespan of the OLED device. Time to decrease from initial brightness (100%) to 95% is called LT95. Compared with the comparative embodiment 1, the maximum external quantum efficiency of the embodiment 1 using the device structure of the present disclosure is improved by 35.7% compared with the comparative embodiment 1, and the LT95 is used as a standard for determination, the service lifespan of the device is extended by more than double.

The embodiments of the present disclosure are described in detail above. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. An organic light-emitting display panel, comprising:
   a substrate;
   a first electrode disposed on the substrate;
   a second electrode disposed on a side of the first electrode away from the substrate and opposite to the first electrode; and
   a light-emitting layer disposed between the first electrode and the second electrode, wherein the light-emitting layer comprises at least two light-emitting units arranged in layers, each of the light-emitting units comprises a first light-emitting sublayer, a second light-emitting sublayer, and a third light-emitting sublayer, the third light-emitting sublayer is disposed between the first light-emitting sublayer and the second light-emitting sublayer;
   wherein the first light-emitting sublayer and the second light-emitting sublayer are both one of a host material layer and a guest material layer, and the third light-emitting sublayer is another one of the host material layer and the guest material layer; and
   wherein a thickness of the light-emitting layer between two adjacent third light-emitting sublayers is greater than a thickness of each of the first light-emitting sublayer and the second light-emitting sublayer located respectively at two ends of the light-emitting layer.

2. The organic light-emitting display panel in claim 1, wherein in each of the light-emitting units, a material of the first light-emitting sublayer and a material of the second light-emitting sublayer are same, and a thickness difference does not exceed 5 Å.

3. The organic light-emitting display panel in claim 1, wherein in adjacent two of the light-emitting units, the first light-emitting sublayer and the second light-emitting sublayer adjacent to each other are both the host material layer, a sum of a thickness of the first light-emitting sublayer and a thickness of the second light-emitting sublayer adjacent to each other is greater than or equal to 15 Å; or in the adjacent two of the light-emitting units, the first light-emitting sublayer and the second light-emitting sublayer adjacent to each other are both the guest material layer, the sum of the thickness of the first light-emitting sublayer and the thickness of the second light-emitting sublayer adjacent to each other is greater than or equal to 3 Å.

4. The organic light-emitting display panel in claim 3, wherein in the adjacent two of the light-emitting units, the thickness of the first light-emitting sublayer and the thickness of the second light-emitting sublayer adjacent to each other are same.

5. The organic light-emitting display panel in claim 3, wherein in the adjacent two of the light-emitting units, the thickness of the first light-emitting sublayer and the thickness of the second light-emitting sublayer adjacent to each other are different.

6. The organic light-emitting display panel in claim 1, wherein a thickness ratio of the guest material layer to the host material layer is less than or equal to 0.25.

7. The organic light-emitting display panel in claim 6, wherein a thickness of each of the light-emitting units is greater than or equal to 2 nm, and the light-emitting layer comprises 2 to 10 of the light-emitting units.

8. The organic light-emitting display panel in claim 6, wherein a thickness of the light-emitting layer ranges from 150 Å to 250 Å.

9. The organic light-emitting display panel in claim 1, wherein an energy level difference between a lowest unoccupied molecular orbital energy level of a host material in the host material layer and a lowest unoccupied molecular orbital energy level of a guest material in the guest material layer is greater than 0 and less than or equal to 0.3 eV; and/or an energy level difference between a highest unoccupied molecular orbital energy level of the guest material in the guest material layer and a highest unoccupied molecular orbital energy level of the host material in the host material layer is greater than 0 and less than or equal to 0.3 eV.

10. The organic light-emitting display panel in claim 1, wherein the guest material layer is a phosphorescent material layer or a fluorescent material layer.

11. The organic light-emitting display panel in claim 10, wherein a wavelength of a luminescence peak of the guest material layer is between 450 nm and 475 nm, a half-width of the guest material layer is less than or equal to 35 nm, and a film-state luminescence quantum yield of the guest material layer is greater than or equal to 60%.

12. An organic light-emitting display device, comprising a processor and an organic light-emitting display panel, wherein the organic light-emitting display panel is electrically connected with the processor, and the organic light-emitting display panel comprises:

a substrate;
a first electrode disposed on the substrate;
a second electrode disposed on a side of the first electrode away from the substrate and opposite to the first electrode; and
a light-emitting layer disposed between the first electrode and the second electrode, wherein the light-emitting layer comprises at least two light-emitting units arranged in layers, each of the light-emitting units comprises a first light-emitting sublayer, a second light-emitting sublayer, and a third light-emitting sublayer, the third light-emitting sublayer is disposed between the first light-emitting sublayer and the second light-emitting sublayer;
wherein the first light-emitting sublayer and the second light-emitting sublayer are both one of a host material layer and a guest material layer, and the third light-emitting sublayer is another one of the host material layer and the guest material layer; and
wherein a thickness of the light-emitting layer between two adjacent third light-emitting sublayers is greater than a thickness of each of the first light-emitting sublayer and the second light-emitting sublayer located respectively at two ends of the light-emitting layer.

13. The organic light-emitting display device in claim 12, wherein in each of the light-emitting units, a material of the first light-emitting sublayer and a material of the second light-emitting sublayer are same, and a thickness difference does not exceed 5 Å.

14. The organic light-emitting display device in claim 12, wherein in adjacent two of the light-emitting units, the first light-emitting sublayer and the second light-emitting sublayer adjacent to each other are both the host material layer, a sum of a thickness of the first light-emitting sublayer and a thickness of the second light-emitting sublayer adjacent to each other is greater than or equal to 15 Å; or in the adjacent two of the light-emitting units, the first light-emitting sublayer and the second light-emitting sublayer adjacent to each other are both the guest material layer, the sum of the thickness of the first light-emitting sublayer and the thickness of the second light-emitting sublayer adjacent to each other is greater than or equal to 3 Å.

15. The organic light-emitting display device in claim 14, wherein in the adjacent two of the light-emitting units, the thickness of the first light-emitting sublayer and the thickness of the second light-emitting sublayer adjacent to each other are same.

16. The organic light-emitting display device in claim 14, wherein in the adjacent two of the light-emitting units, the thickness of the first light-emitting sublayer and the thickness of the second light-emitting sublayer adjacent to each other are different.

17. The organic light-emitting display device in claim 12, wherein a thickness ratio of the guest material layer to the host material layer is less than or equal to 0.25.

18. The organic light-emitting display device in claim 17, wherein a thickness of the light-emitting units is greater than or equal to 2 nm, and the light-emitting layer comprises 2 to 10 of the light-emitting units.

19. The organic light-emitting display device in claim 17, wherein a thickness of the light-emitting layer ranges from 150 Å to 250 Å.

20. The organic light-emitting display device in claim 12, wherein an energy level difference between a lowest unoccupied molecular orbital energy level of a host material in the host material layer and a lowest unoccupied molecular orbital energy level of a guest material in the guest material layer is greater than 0 and less than or equal to 0.3 eV; and/or an energy level difference between a highest unoccupied molecular orbital energy level of the guest material in the guest material layer and a highest unoccupied molecular orbital energy level of the host material in the host material layer is greater than 0 and less than or equal to 0.3 eV.

* * * * *